(12) United States Patent
Parekh

(10) Patent No.: US 7,897,485 B2
(45) Date of Patent: Mar. 1, 2011

(54) WAFER PROCESSING INCLUDING FORMING TRENCH ROWS AND COLUMNS AT LEAST ONE OF WHICH HAS A DIFFERENT WIDTH

(75) Inventor: Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/504,385

(22) Filed: Jul. 16, 2009

(65) Prior Publication Data

US 2009/0280584 A1 Nov. 12, 2009

Related U.S. Application Data

(62) Division of application No. 12/025,623, filed on Feb. 4, 2008, now Pat. No. 7,622,365.

(51) Int. Cl.
H01L 21/46 (2006.01)
H01L 21/78 (2006.01)
H01L 21/301 (2006.01)

(52) U.S. Cl. ............ 438/462; 438/463; 438/464

(58) Field of Classification Search ........ 438/462, 438/463, 464; 257/E21.523
See application file for complete search history.

(56) References Cited

U.S. PATENT DOCUMENTS

| | | |
|---|---|---|
| 5,340,772 A | 8/1994 | Rosotker |
| 5,910,687 A | 6/1999 | Chen et al. |
| 5,925,260 A | 7/1999 | Jiang |
| 6,017,776 A | 1/2000 | Jiang et al. |
| 6,074,896 A * | 6/2000 | Dando ............... 438/114 |
| 6,365,958 B1 | 4/2002 | Ibnabdeljalil et al. |
| 6,869,861 B1 | 3/2005 | Glenn et al. |
| 6,873,024 B1 | 3/2005 | Prabhu et al. |
| 6,890,836 B2 | 5/2005 | Howard et al. |
| 6,933,212 B1 | 8/2005 | Lee et al. |
| 6,995,032 B2 * | 2/2006 | Bruhns et al. ........... 438/33 |
| 7,052,977 B1 | 5/2006 | Yegnashankaran et al. |
| 7,109,068 B2 | 9/2006 | Akram et al. |
| 7,129,114 B2 | 10/2006 | Akram |
| 7,169,685 B2 | 1/2007 | Connell et al. |
| 7,179,720 B2 | 2/2007 | Mulligan |
| 7,199,449 B2 | 4/2007 | Lake |
| 7,259,043 B2 | 8/2007 | Rolda, Jr. et al. |
| 7,291,543 B2 | 11/2007 | Grigg et al. |
| 2004/0185580 A1 | 9/2004 | Goh |
| 2004/0266139 A1 | 12/2004 | Shibata |
| 2005/0126686 A1 | 6/2005 | Cheong et al. |
| 2007/0262424 A1 | 11/2007 | Hiatt |

\* cited by examiner

Primary Examiner—William M. Brewster
(74) Attorney, Agent, or Firm—Brooks, Cameron & Huesbch, PLLC

(57) ABSTRACT

Methods for processing semiconductor wafers are described herein. One embodiment includes removing portions of a first side of the semiconductor wafer to form a number of trenches of a particular depth in rows and columns. The method further includes forming a passivation layer on side walls of the number of trenches. The method also includes cutting a second side of the semiconductor wafer in rows and columns aligned with the number of trenches such that the semiconductor wafer singulates into a number of dice.

20 Claims, 12 Drawing Sheets

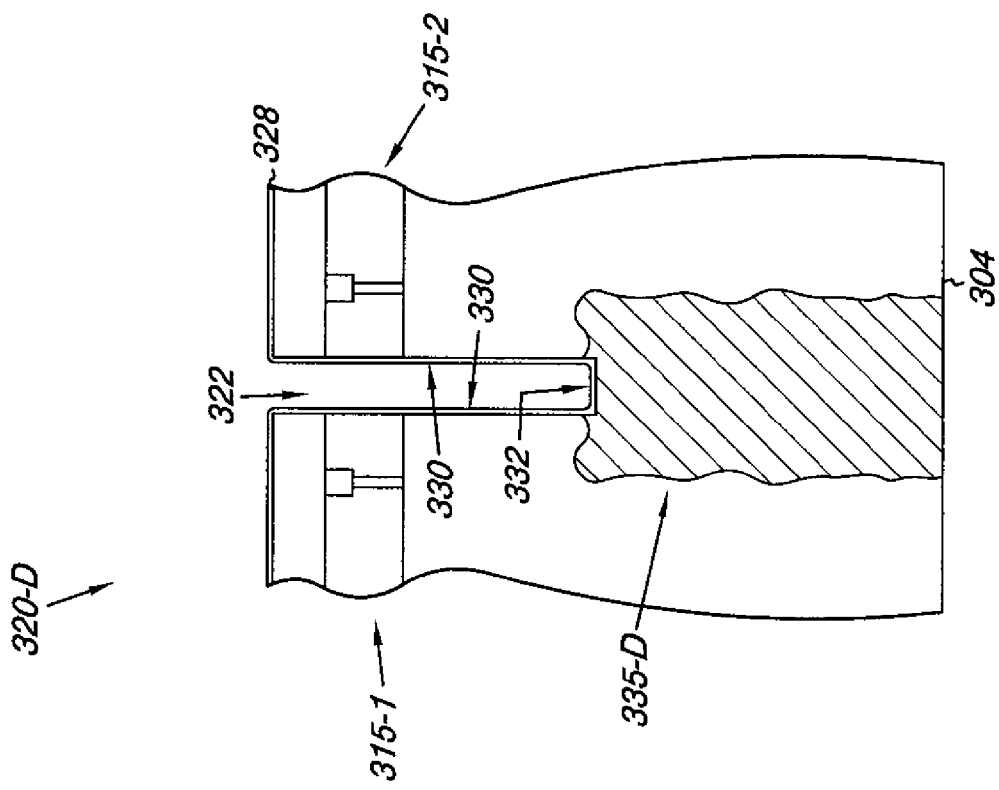
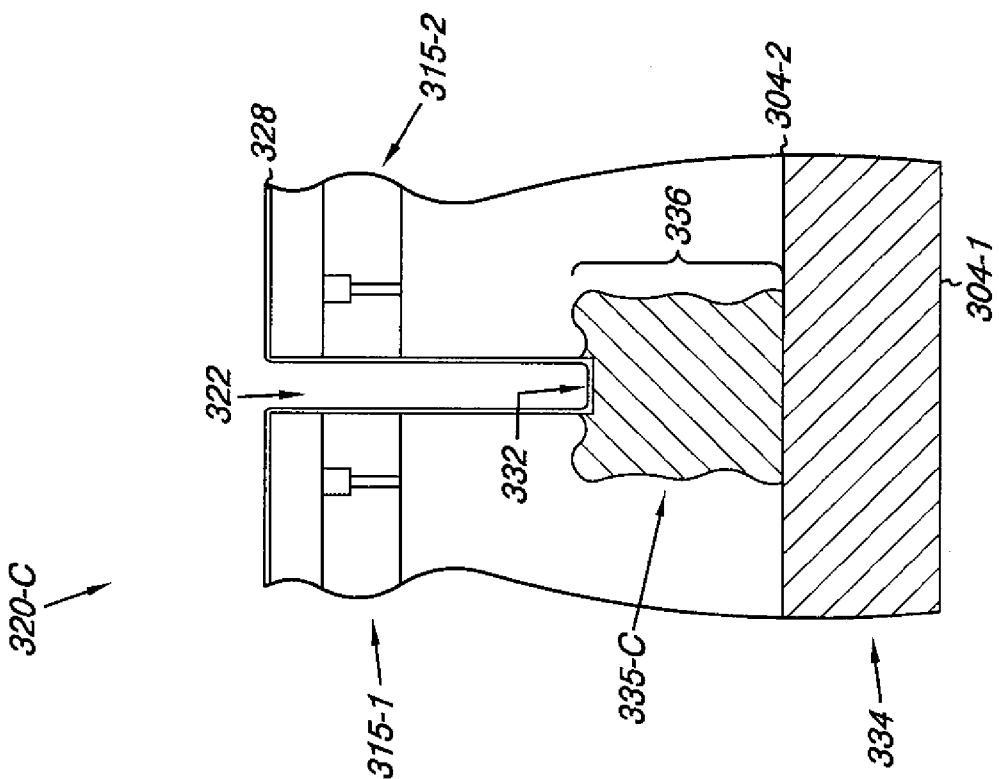

WAFER PROCESSING INCLUDING FORMING TRENCH ROWS AND COLUMNS AT LEAST ONE OF WHICH HAS A DIFFERENT WIDTH

CROSS-REFERENCE TO RELATED APPLICATIONS

This application is a divisional of U.S. application Ser. No. 12/025,623, now U.S. Pat. No. 7,622,365, filed Feb. 4, 2008, the entire specification of which is herein incorporated by reference.

TECHNICAL FIELD

The present disclosure relates generally to electronic semiconductors and, more particularly, to processing semiconductor wafers.

BACKGROUND

To form individual electronic devices from a semiconductor wafer, various electronic circuitry can be formed on a front side of the semiconductor wafer. The electronic devices can be arranged in a grid-like pattern on the semiconductor wafer. In order to separate, e.g., singulate, the devices, the semiconductor wafer can be diced by various means.

One method of dicing a semiconductor wafer is to cut through the wafer from the front side, e.g., the side on which electronic devices are formed, with a rotating saw blade. However, using a saw blade in such a manner can have various processing limitations. For example, the width of the saw blade reduces the overall usable area of the semiconductor wafer. Furthermore, sawing through a semiconductor wafer can cause microcracks near the edge of the saw street, which may propagate and at least partially cause a failure for some electronic devices formed near the edges of saw streets.

Some methods for semiconductor wafer processing include forming test circuits in areas of the wafer that will be used as saw streets during singulation. These testing circuits can be probed to help determine whether certain of the electronic devices formed on the wafer are functioning properly.

BRIEF DESCRIPTION OF THE DRAWINGS

FIGS. 3A-3D illustrate cross-sectional side views of segments of a semiconductor wafer processed according to one or more embodiments of the present disclosure.

DETAILED DESCRIPTION

Methods for processing semiconductor wafers are described herein. One embodiment includes removing portions of a first side of the semiconductor wafer to form a number of trenches of a particular depth in rows and columns. The method further includes forming a passivation layer on side walls of the number of trenches. The method also includes cutting a second side of the semiconductor wafer in rows and columns aligned with the number of trenches such that the semiconductor wafer singulates into a number of dice.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure.

As used in this disclosure, the terms "wafer" and "substrate" are used interchangeably and are to be understood as including, but not limited to, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" or "substrate" in the following description, previous process steps may have been utilized to form regions or junctions in the base semiconductor structure or foundation.

Figure 1:
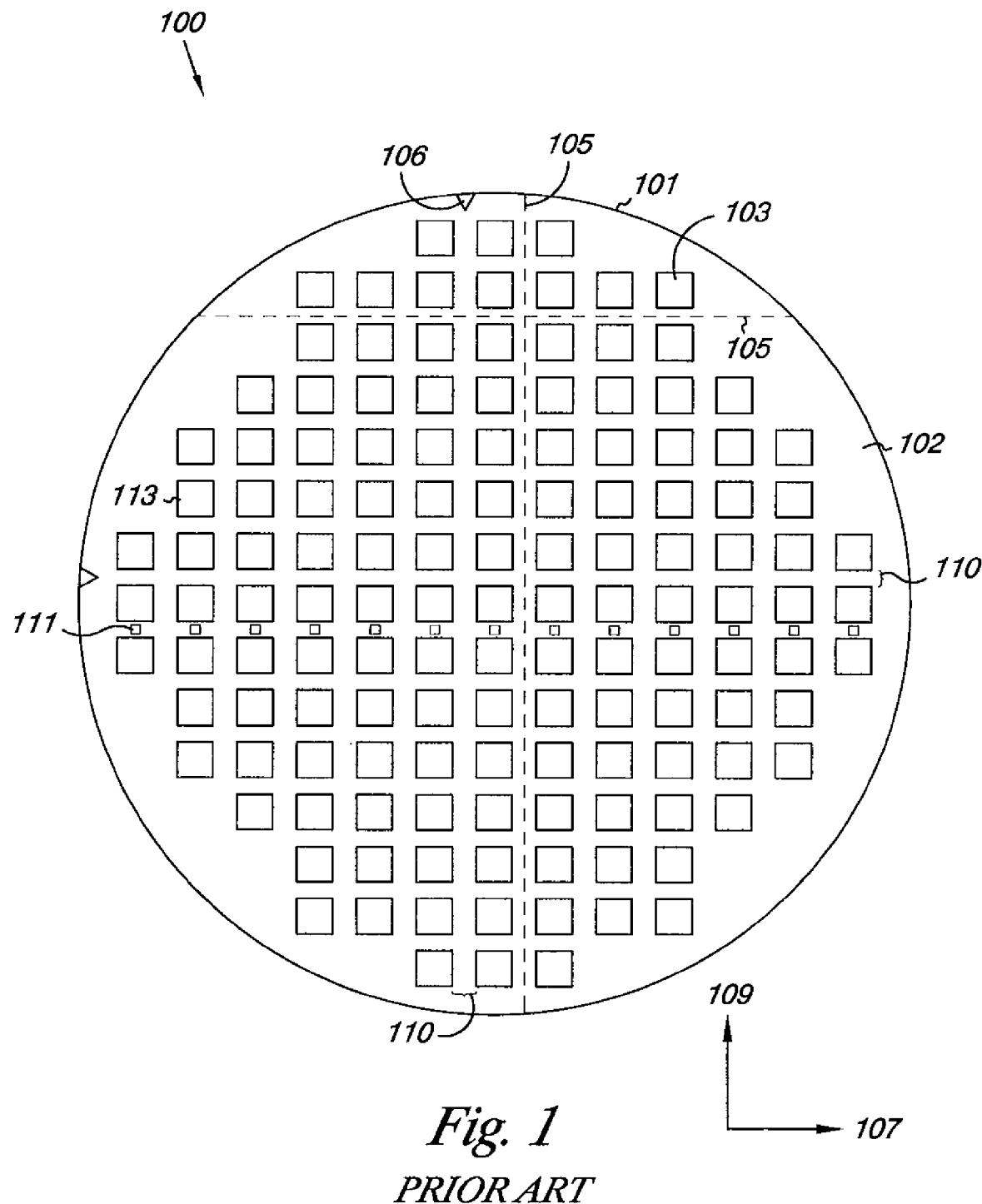
FIG. 1 illustrates a prior art top view of a semiconductor wafer.

FIG. 1 illustrates a prior art top view of a semiconductor wafer 100. As illustrated in FIG. 1, the wafer 100 can have a round peripheral edge 101. The wafer 100 can include a number of dice 103 having streets 105 located therebetween. As used herein, streets 105 may be referred to as saw streets or scribe streets, e.g., paths along which a tool may cut in order to singulate the dice 103. Prior to a cutting, the streets 105 may be etched to a particular depth to help guide a saw blade. Furthermore, one or more sidemarks 106 along the edge 101 of the top of the wafer 100 can be used to align the saw blade before cutting. Although two sidemarks 106 are illustrated, a wafer 100 could include more or fewer sidemarks 106. For example, the wafer 100 could include a sidemark 106 at the edge 101 of every street 105.

In many cases, and as shown in FIG. 1, the dice 103 can be formed on the wafer 100 such that the streets 105 are formed in perpendicular rows 107 and columns 109. As illustrated in FIG. 1, according to some previous approaches, the streets 105 forming rows 107 and columns 109 can have a same width 110. That is, each of the streets 105 in each direction can be formed to the same width 110.

The dice 103 can comprise electronic devices 113. As used herein, an electronic device 113 can include transistors, capacitors, diodes, memory devices, processors, other devices, and/or integrated circuits. A testing circuit 111, as used herein, can include circuits for determining the functionality of one or more electronic devices 113 formed on the semiconductor wafer 100. For example, a testing circuit 111 can include a contact pad for probing to determine whether one or more electronic devices 113 associated with the testing circuit 111 are functional. Although testing circuits 111 are illustrated in only one row 107, they can be formed in more than one street 105, all streets 105, or on portions of one or more streets 105. These testing circuits 111 can be probed after formation of the electronic devices 113 and before the wafer 100 is diced. After a determination has been made as to which of the electronic devices 113 formed on the wafer 100 are functional, the wafer 100 can be diced, e.g., by a rotating saw blade cutting along the streets 105, thereby destroying the testing circuits 111, which may no longer serve a purpose.

In various previous wafer processing approaches, one or more rotating saw blades can be used to singulate the dice 103 by cutting along the streets 105. In such approaches, the saw blade can enter the peripheral edge 101 of the wafer 100 at a blade entry point, e.g., a sidemark 106, such that the blade is aligned with a particular street. As the saw blade dices the wafer 100, it can make contact with a top surface 102 of the wafer 100. The saw blade can also contact side surfaces of the number of streets 105, which may include side surfaces of electronic devices 113 when they are formed such that there is no substrate barrier between the electronic device 113 and the street. For processing methods including a substrate barrier between the electronic devices 113 and the saw street 105, microcracks that may form in the side surface on the substrate can propagate into the electronic device 113 at least partially in response to mechanical, thermal, chemical, or other stresses that the wafer 100 may be subjected to during processing.

An example of a previous approach to reduce the amount of semiconductor wafer dedicated to saw streets and mitigate the potential for damage from microcracks is described in U.S. Pat. No. 6,890,836 to Howard et al. The '836 patent appears to describe a method to etch trench streets in the front side of a semiconductor wafer and then singulate by cutting from the backside of the wafer to the bottom of the trenches. Another method that appears to be described in the '836 patent avoids the use of a saw altogether by etching trench streets in the front side of a wafer, then backgrinding to singulate the dice.

Another example of a previous approach to reduce the width of saw streets is described in U.S. Pat. No. 7,052,977 to Yegnashankaran et al. The '977 patent appears to describe a method of dicing a semiconductor wafer by at least etching a number of trenches in the top surface of the wafer, then thinning the bottom surface until the wafer singulates into dice. The '977 patent teaches that the etch forms street openings that vertically weaken the wafer along a stress line extending from the street region vertically down towards the bottom surface of the wafer.

However, microcracks and/or other damage to thin films and/or electronic devices may still occur near the boundary of the etched trenches using methods described in the '836 and/or '977 patents. Backgrinding and/or sawing from the backside of the semiconductor wafer, e.g., as the grinder and/or saw blade approach the trench, can contribute to cracking and/or other damage. Backgrinding a wafer with an open trench can cause stress and/or deformation along one or more of the trench walls. Such factors may damage one or more electronic devices formed on the wafer.

Some methods, like the '836 patent describe above, may narrow the width of the saw streets, e.g., the width between electronic devices, to a point where they are too thin to support placement of testing circuits. Such methods may require placement of testing circuits on areas of the semiconductor wafer that could otherwise be used for the formation of electronic devices, thereby at least partially reducing one or more benefits of narrowing the saw street.

FIGS. 2A-2D illustrate top views of semiconductor wafers processed according to one or more embodiments of the present disclosure. Semiconductor wafers processed according to various embodiments described herein can provide a greater number of dice, e.g., electronic devices, per wafer while reducing a likelihood of device failure due to processing conditions, e.g., dicing the wafer. Such embodiments can retain an ability to test one or more electronic devices while reducing widths of certain streets between devices.

Figure 2A:
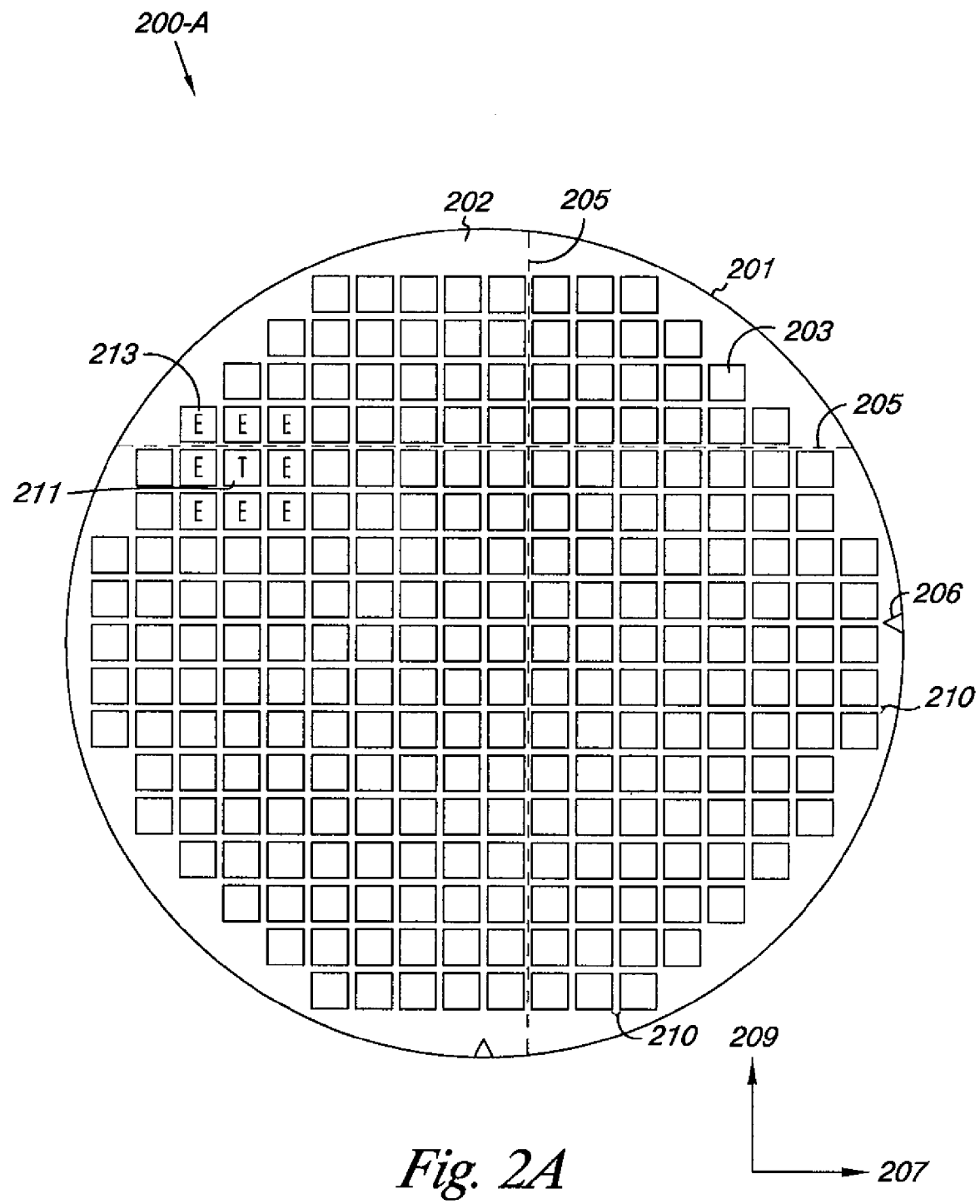
FIGS. 2A-2D illustrate top views of semiconductor wafers processed according to one or more embodiments of the present disclosure.

FIG. 2A illustrates a top view of a semiconductor wafer 200-A processed according to one or more embodiments of the present disclosure. Prior to processing, the wafer 200-A can be substantially similar to the wafer 100 processed according to some previous approaches, such as is illustrated in FIG. 1. That is, the wafer 200-A can have a round peripheral edge 201 with one or more sidemarks 206, and have substantially similar dimensions to the wafer 100 illustrated in FIG. 1. For example, the wafer 200-A can, prior to processing, have a thickness between approximately 500-750 micrometers and a width of approximately eight inches (~200 millimeters). Drawings are not to scale.

As can be seen from a comparison of FIG. 2A with FIG. 1, the wafer 200-A illustrated in FIG. 2A contains more dice 203, e.g., chips, devices, etc., than the wafer 100 illustrated in FIG. 1. The distance between the dice 203, e.g., the width 210 of the streets 205, has been decreased for all streets 205 in both vertical 209 and horizontal 207 orientations. Various methods for achieving reduced street 205 widths 210 are described below in connection with FIGS. 3A-5F, e.g., by etching narrower trench rows and columns than can be cut by a saw blade. Some previous approaches, such as that illustrated in FIG. 1, include street 205 widths 210 of approximately 25-50 micrometers, e.g., an approximate width of a saw blade used to singulate the dice 203 plus any buffer region around the saw street 205. In contrast, the top surface 202 of wafer 200-A can be etched between dice 203 to widths 210 between approximately 5-10 micrometers.

In the embodiment illustrated in FIG. 2A, each die 203 may comprise a device, e.g., an electronic device 213 or a testing circuit 211. In some embodiments, testing circuits 211 may be formed in the saw streets 205 prior to singulation. However, in embodiments where all saw streets 205 are reduced in width 210, as illustrated in FIG. 2A, testing circuits 211 may be relocated to one or more dice 203 if the saw street 205 is too narrow to house such a testing circuit 211. For example, one die 203 could comprise a testing circuit 211 capable of testing any of the eight dies 203 adjacent thereto. An example illustration of this appears in FIG. 2A as indicated by testing circuit 211 "T" surrounded by eight electronic devices 213 "E." In such an example, one out of every nine dice 203 could be a testing circuit 211 rather than an electronic device 213.

Therefore, forming electronic devices 213 according to a method where all streets 205 are reduced to a width 210 narrow enough that testing circuits 211 no longer fit in the saw streets 205 can still provide a greater yield of a total number of electronic devices 213 per wafer 200-A as long as the increased number of dice 203 per wafer 200-A is great enough to account for the need to use certain dice 203 as testing circuits 211. Generally, the increased number of dice 203 per wafer 200-A should be greater than the number of dice 203 originally produced divided by the number of electronic devices 213 a single testing circuit 211 can test, assuming each device needs to be tested. This can be represented by the equation: $y > x/q$, where y is the increased number of dice 203, x is the original number of dice 203, and q is the number of electronic devices 213 that a single testing circuit 211 can test. In the example above, where a single testing circuit 211 can test eight electronic devices, the result is that the number of dice 203 should be increased by ⅛ (~12.5%). Embodiments are not so limited. A single testing circuit 211 located on a die 203 could be used to test more or fewer electronic devices 213 located on other dice 203.

Figure 2B:
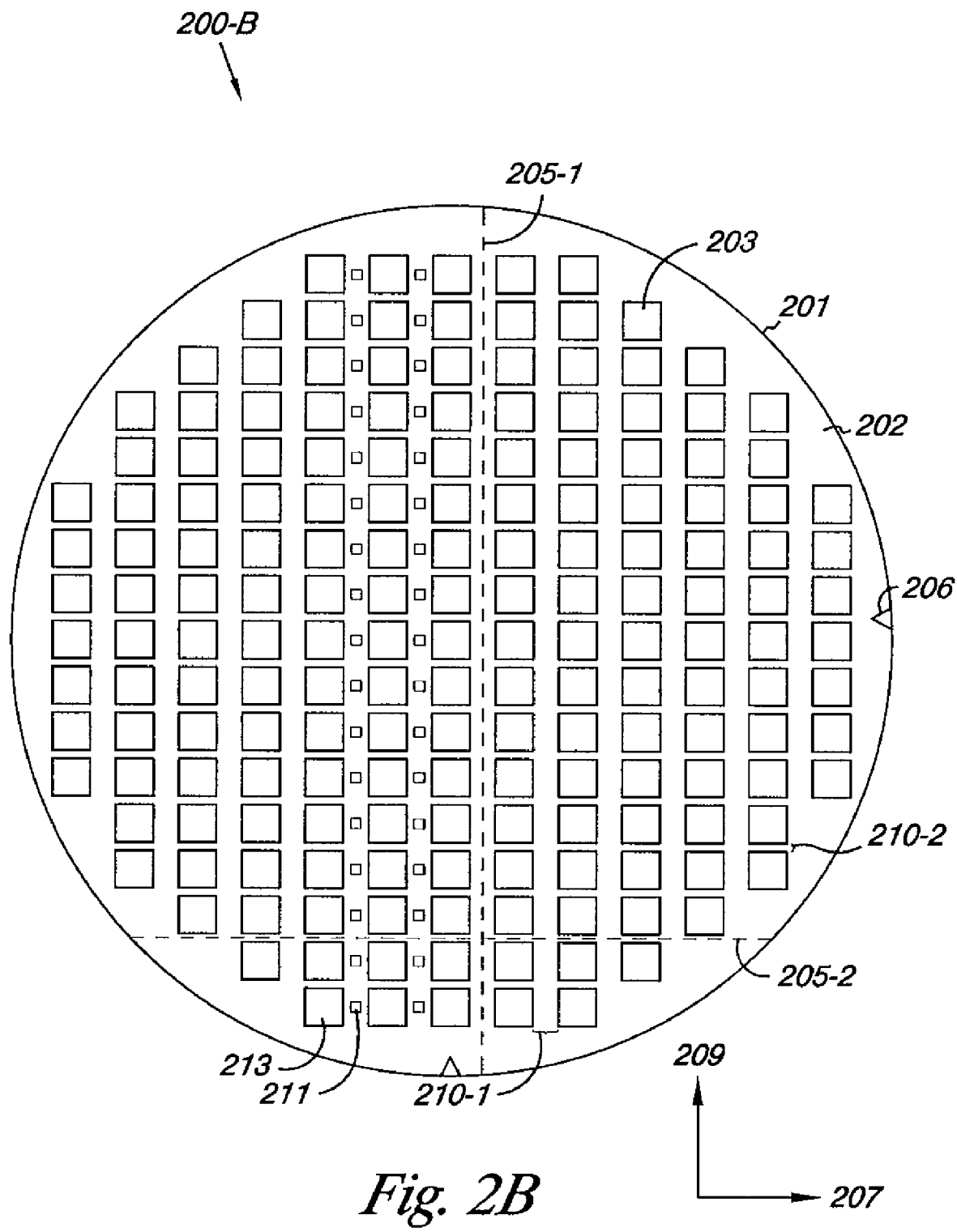

FIG. 2B illustrates a top view of a semiconductor wafer 200-B processed according to one or more embodiments of the present disclosure. Prior to processing, the wafer 200-B can be substantially similar to the wafer 200-A described in connection with the embodiment illustrated in FIG. 2A prior to its processing. For example, the wafer 200-B can include one or more sidemarks 206 for aligning a saw blade. When cutting is performed from a backside of the wafer 200-B, the saw blade can be aligned to sidemarks 206 on the front surface 202 of the wafer 200-B.

The wafer 200-B illustrated in FIG. 2B includes more dice 203 than the wafer 100 illustrated in FIG. 1, but fewer than the wafer 200-A illustrated in FIG. 2A. The wafer 200-B illustrated in FIG. 2B includes narrower streets 205-2 in the horizontal direction 207, e.g., trench rows, than streets 205-1 the vertical direction 209, e.g., trench columns. For example, the trench rows can be etched to a width 210-2 of approximately 5-10 micrometers, while the trench columns can be etched to a width 210-1 sufficient to house a testing circuit 211, e.g., greater than 25 micrometers. As one of ordinary skill in the art will appreciate, as the wafer 200-B has a circular edge 201, it is not critical which direction is defined as vertical 209 (column) or horizontal 207 (row) as long as the two directions are perpendicular to each other.

The embodiment illustrated in FIG. 2B also includes a number of testing circuits 211 located in the vertical streets 205-1, e.g., trench columns. A testing circuit 211 can be formed adjacent to each die 203, or spaced differently depending on the characteristics of the particular testing circuit 211. For example, a single testing circuit 211 may be designed to test one die 203, e.g., electronic device 213, or more than one die. One of ordinary skill in the art having read and understood the present disclosure will understand an appropriate placement scheme for testing circuits 211 based on their characteristics. Semiconductor wafers processed, e.g., singulated or diced, according to the embodiment illustrated in FIG. 2B can provide a greater number of dice 203 housing electronic devices 213 per wafer 200-B than some previous approaches, while simultaneously allowing the placement of testing circuits 213 in the saw streets, e.g., not placing testing circuits on a die 203.

Figure 2C:
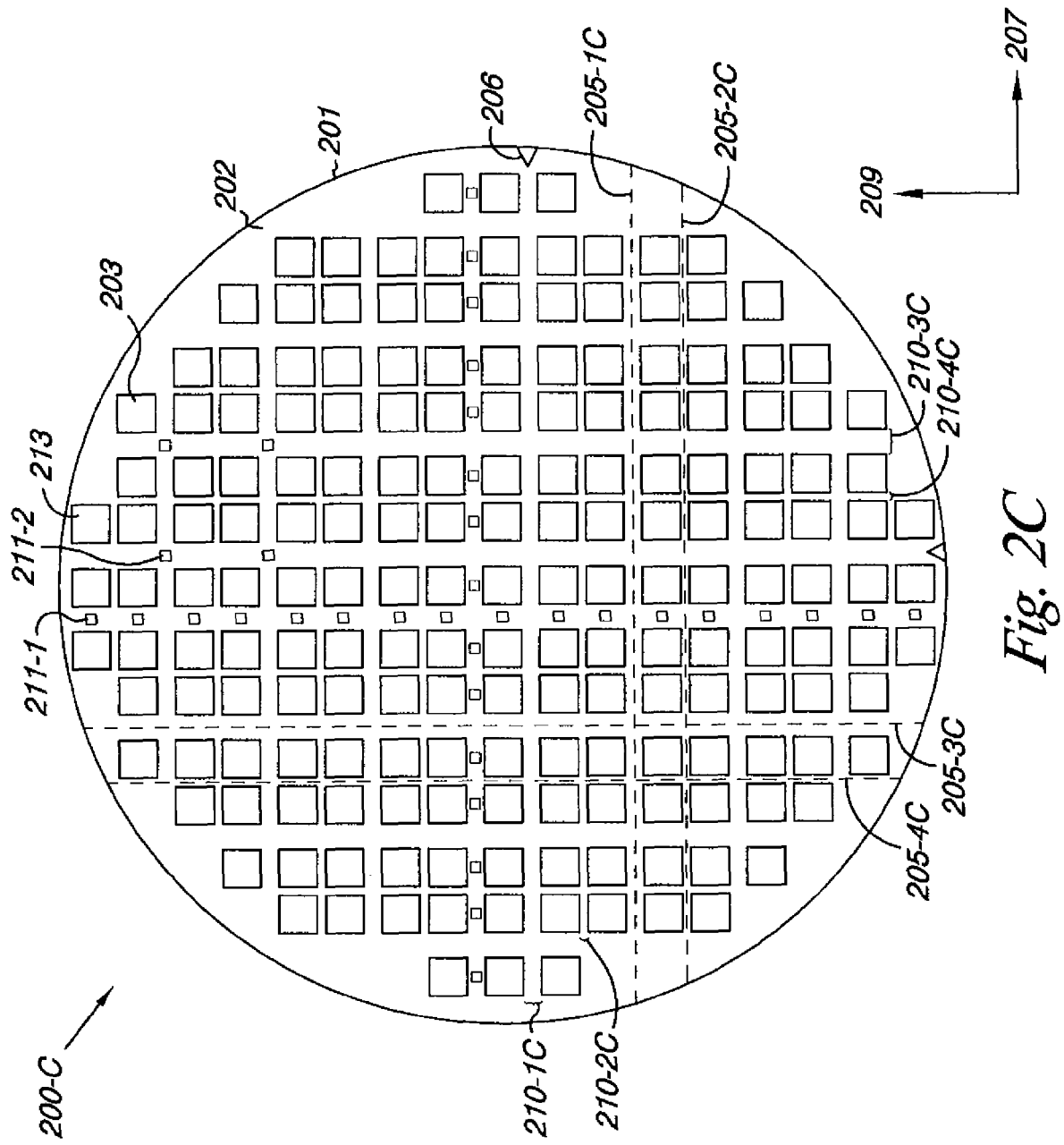

FIG. 2C illustrates a top view of a semiconductor wafer 200-C processed according to one or more embodiments of the present disclosure. Prior to processing the wafer 200-C can be substantially similar to wafers described above in FIGS. 1-2B, prior to their processing. The wafer 200-C can include one or more sidemarks 206 for saw blade alignment. A sidemark 206 can be used for alignment with one or more, or even all, streets in each direction. As noted above, sidemarks 206 on a top surface 202, e.g., front side, of a wafer 200-C can be used for aligning a saw blade for cutting from the backside of the wafer 200-C. Other methods of saw blade alignment can be used with the various embodiments of the present disclosure including, but not limited to, optical, infrared, laser, and others as will be known to one of ordinary skill in the art.

In the embodiment illustrated in FIG. 2C, every other trench row and column, e.g., vertical 209 and horizontal 207 streets, starting from the center and radiating out, are etched to a greater width than the alternating trench rows and columns. For example, the narrower streets 205-2C and 205-4C can be etched to approximately 5-10 micrometers in width 210-2C and 210-4C, while the wider streets 205-1C and 205-3C can be etched to a width 210-1C and 210-3C greater than approximately 25 micrometers to allow for the placement of one or more testing circuits therein. However, the width 210-1C of the wider horizontal streets 250-1C does not necessarily have to be the same as the width 210-3C of the wider vertical streets 205-3C. Likewise, the width 210-2C of the narrower horizontal streets 205-2C does not have to be the same as the width 210-4C of the narrower vertical streets 205-4C.

Testing circuits 211-1 can be formed, e.g., placed, adjacent to one or more dice 203 on the wider streets, e.g., streets 205-1C and 205-3C. Alternatively, the testing circuits 211-2 can be placed at the intersections of the wider streets, e.g., streets 205-1C and 205-3C, forming four "corner-posts" around a group of four dice 303. One of ordinary skill in the art, having read and understood the present disclosure will appreciate additional testing circuit placement schemes, which will not deviate from the scope of this disclosure. The embodiment illustrated in FIG. 2C provides additional options for processing semiconductor wafers, e.g., singulating or dicing, for yielding a greater number of dice 203 housing electronic devices 213 per wafer 200-C than some previous approaches, while simultaneously allowing the placement of testing circuits, e.g., testing circuit 211-1, in the saw streets, e.g., as opposed to placing testing circuits on a die 203. However, according to embodiments described herein, testing circuits may be placed on dice 203, streets, e.g., street 205-1, or a combination thereof.

Figure 2D:
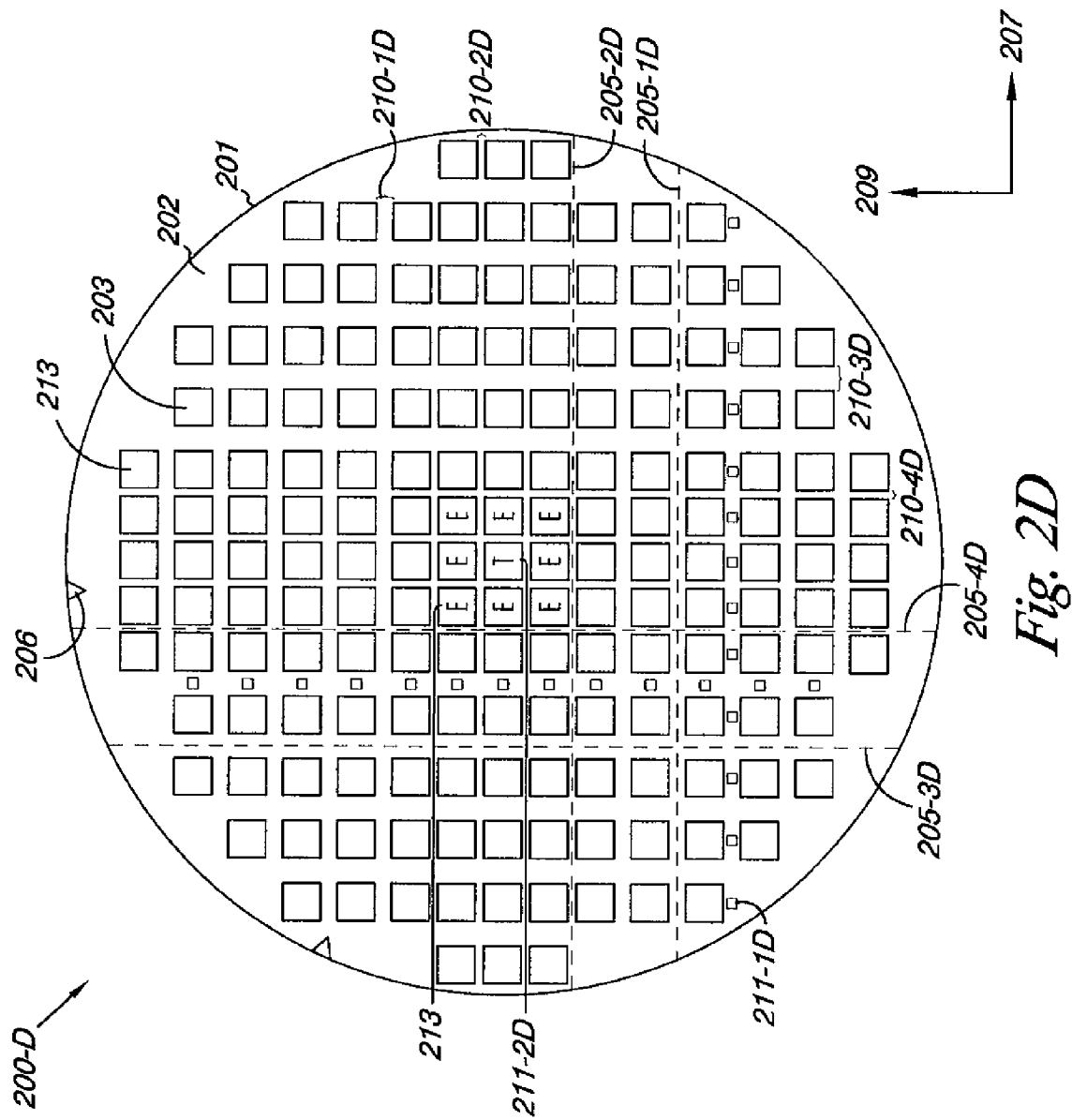

FIG. 2D illustrates a top view of a semiconductor wafer 200-D processed according to one or more embodiments of the present disclosure. Prior to processing the wafer 200-D can be substantially similar to wafers described above prior to their processing. For example, the wafer can have a round peripheral edge 201 and one or more sidemarks 206 on a top, e.g., front, surface 202.

The embodiment illustrated in FIG. 2D includes streets of varying widths in the horizontal 207 and vertical 209 directions. Streets, e.g., street 205-4D, formed near the center of the wafer in columns have a relatively narrow width 210-4D compared to streets, e.g., street 205-3D formed closer to the edges of the wafer in columns with a relatively wide width 210-3D. Likewise, streets, e.g., street 205-2D, formed near the center of the wafer in rows have a relatively narrow width 210-2D compared to streets, e.g., street 205-1D formed closer to the edges of the wafer in rows with a relatively wide width 210-1D. For example, streets formed to the narrower width may be etched to a width between approximately 5-10 micrometers, while streets formed to the wider width may have a width greater than approximately 25 micrometers.

The wafer 200-D can have a number of dice 203 formed on the top surface 202 as electronic devices 213 and/or testing circuits, e.g., testing circuit 211-2D. Testing circuits, e.g., testing circuit 211-1D, may be formed in the streets between dice 203. For example, testing circuits formed in streets can be formed in streets having relatively wider widths, while testing circuits formed on a die can be formed on die surrounded by streets having relatively narrower widths.

Although the embodiment illustrated in FIG. 2D can include testing circuits sufficient to test each electronic device, more testing devices may be formed in streets between dice closer to the edges of the wafer, as opposed to dice formed near the center of the wafer. Such embodiments may be useful for wafer used to form electronic devices known to have a higher average yield in certain areas of the wafer, e.g., near the center of the wafer. That is, such embodiments can allow for a greater number of dice, e.g., electronic devices, to be formed in areas of the wafer that tend to produce higher yields, e.g., devices that do not fail, on average. Embodiments are not limited to arranging street widths such that they are narrower in the center of the wafer, other portions of the wafer, e.g., other portions that may produce a higher yield on average, may be selected to produce a greater number of dice by adjusting street widths accordingly, as will be appreciated by one of ordinary skill in the art having read and understood the present disclosure.

FIGS. 3A-3D illustrate cross-sectional side views of segments of a semiconductor wafer processed according to one or more embodiments of the present disclosure. The processes illustrated in FIGS. 3A-3D can function to provide an additional barrier to microcrack propagation near electronic devices. Such embodiments can be process efficient because many electronic devices have a passivation layer applied as one of the process steps during formation. Therefore applying the passivation layer as a barrier between saw streets and electronic devices can be achieved using a common process step with device formation.

Figure 3B:
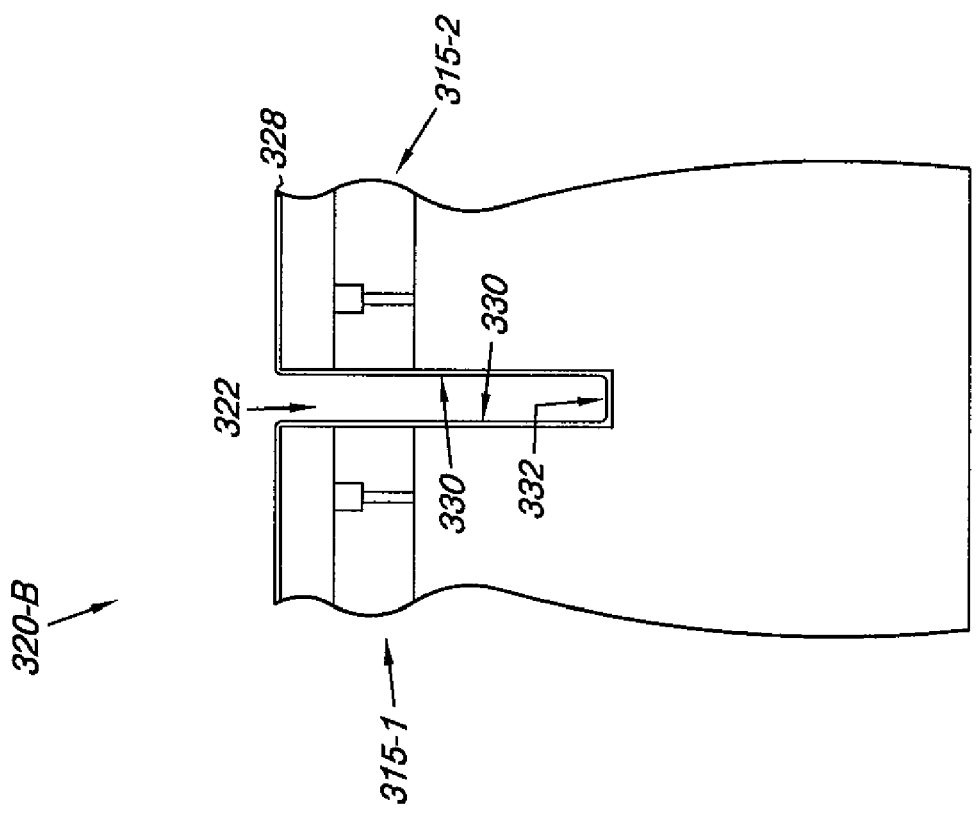
Figure 3A:
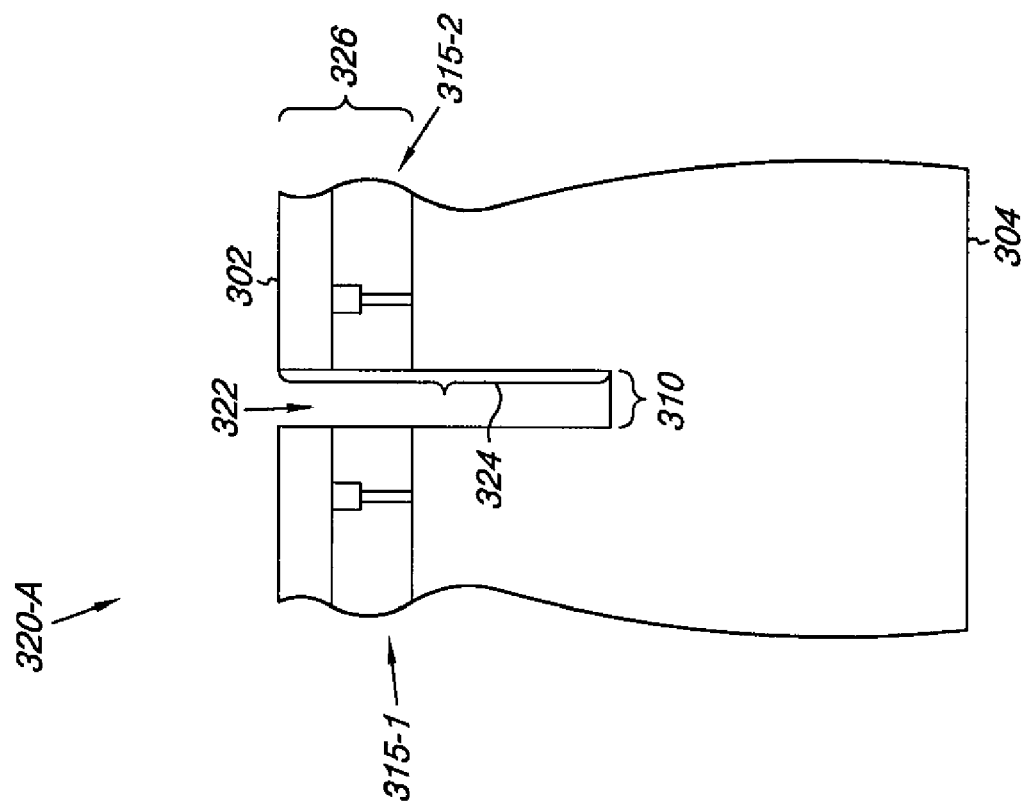

FIG. 3A illustrates a cross-sectional view of a segment 320-A of a semiconductor substrate, e.g., bulk silicon, having a top surface 302, e.g., a front side of the wafer, and a bottom surface 304, e.g., a backside of the wafer. The segment 320-A of the semiconductor substrate is illustrated including a first device 315-1 and a second device 315-2 formed proximate to the top surface 302, e.g., front side of the wafer, according to a previous process that will be understood by one of ordinary skill in the art. In one or more embodiments, the devices may comprise electronic devices and/or testing circuits.

The segment 320-A of semiconductor substrate is illustrated with a portion removed from the top surface 302, e.g., from the front side of the wafer when viewed from a top view, that forms a narrow trench 322, e.g., having a width 310 of approximately 5-10 micrometers, to a particular depth 324, e.g., approximately 30-60 micrometers from the top surface 302. That is, a length of a trench sidewall, e.g., sidewall 330 in FIG. 3B, can be between approximately 30-60 micrometers. Embodiments are not so limited. As illustrated in FIG. 3A, the trench 322 can extend between the first device 315-1 and second device 315-2 to a depth 324 greater than the depth 326 of the electronic and/or testing circuits, e.g., devices 315-1 and 315-2. The portion can be removed, for example, by anisotropically dry etching the semiconductor wafer, e.g., by plasma etching, reactive ion etching, or other methods. Etch chemistries can include $SF_6/O_2/HBr$, $SF_6/C_4F_8/HBr$, or other chemistries as will be understood by one of ordinary skill in the art. Prior to etching, a photoresist mask may be formed over areas of the wafer desired to be protected from the etching process. When viewed from a top view, etches in the semiconductor wafer can extend along the length of each street, forming perpendicular rows and columns on the front side of the wafer, e.g., as illustrated in FIG. 2A.

FIG. 3B illustrates a cross-sectional view of a segment 320-B of the semiconductor substrate, e.g., segment 320-A illustrated in FIG. 3A, at a subsequent processing point. After portions of the substrate have been removed, e.g., etched, a passivation layer 328 can be formed on the side walls 330 and bottom 332 of the trenches 322, as well as over the devices 315-1 and 315-2, e.g., electronic and/or testing circuits. In embodiments where the devices are electronic devices, the same passivation layer 328 can be used to coat the trench 322 and to passivate the electronic device, e.g., a transistor. Accordingly, a single processing step can be employed to reduce fabrication cost and time.

Furthermore, coating the trench 322 with a passivation layer 328 can provide additional protection against the formation of microcracks beyond the trench wall that may propagate near the devices 315-1 and 315-2. Microcracks may result from planarizing, e.g., backgrinding, and/or cutting the wafer. In embodiments where a rotating wafer saw and/or backgrinder approach a trench 322, stresses to the material from the saw and/or grinder can travel along trench walls. A microcrack traveling through the passivation layer 328 is less likely to transition across a barrier formed at the intersection of different materials, e.g., bulk silicon and the passivation layer 328 and/or some components of the electronic devices 315-1 and 315-2 and the passivation layer 328. As described above, such microcracks can contribute to failure or reduced functionality of one or more devices, e.g., device 315-1, formed on the semiconductor wafer.

The passivation layer 328 can be formed as silicon nitride (SiN), silicon oxynitride (SiON), titanium nitride (TiN), or another passivating material as will be understood by one of ordinary skill in the art. The passivation layer 328 can be formed by methods such as chemical vapor deposition, pulsed laser deposition, sputter deposition, atomic layer deposition, and molecular beam epitaxy, among other methods.

FIG. 3C illustrates a cross-sectional view of a segment 320-C of the semiconductor substrate, e.g., segment 320-B illustrated in FIG. 3B, at a subsequent processing point. After the passivation layer 328 has been formed, the bottom 304-1, e.g., backside, of the waver can be thinned 334, e.g., through mechanical backgrinding, chemical etching, mechanical polishing, and/or chemical mechanical polishing/planarization (CMP). Prior to thinning, a protective layer may be applied to the wafer to protect the previously formed devices. In one or more embodiments using the processes illustrated in FIGS. 3A-3D, the semiconductor wafer can be thinned 334 such that a particular thickness 336 of substrate remains between the bottom 332 of the trenches 322 and the backside 304-2 (after thinning) of the wafer. The particular thickness 336 remaining after thinning, e.g., backgrinding, can help to provide electrical and physical isolation for electronic devices, e.g., devices 315-1 and 315-2, formed on the wafer.

FIG. 3D illustrates a cross-sectional view of a segment 320-D of the semiconductor substrate, e.g., segment 320-B illustrated in FIG. 3B, at a subsequent processing point. In one or more embodiments, the processing step illustrated in FIG. 3D, e.g., cutting 335-D the wafer, can occur after the processing step illustrated in FIG. 3B, e.g., after forming a passivation layer 328 on the wafer. Such an embodiment is illustrated in FIG. 3D at cut 335-D. In some embodiments, the processing step illustrated in FIG. 3D can occur after the processing step illustrated in FIG. 3C, e.g., after thinning 334 the wafer. Such an embodiment is illustrated in FIG. 3C at cut 335-C.

After the passivation layer 328 has been formed, a backside 304 of the semiconductor wafer can be cut 335-D, e.g., with a rotating wafer saw, to the bottom 332 of the trench 322. From a bottom-view perspective, the wafer can be cut in rows and columns aligned with the number of trenches such that the semiconductor wafer singulates into a number of dice, e.g., where a die includes a device, e.g., an electronic device such as devices 315-1 and 315-2. Accordingly, the saw blade does not contact a surface of the substrate adjacent to the devices, e.g., trench side walls 330. As a result, any microcracks that may form in the wafer because of the rotating saw blade are less likely to propagate to an area where they would be likely to affect the functionality of the devices 315-1 and 315-2. Furthermore, as described above with respect to FIG. 3B, if microcracks propagate in the portion of the passivation layer 328 that coats the trenches 322, e.g., due to contact with the saw blade, the passivation layer 328 can act as a barrier between the microcracks and the devices 315-1 and 315-2 by absorbing the microcracks and helping to prevent transition thereof into the electronic devices, e.g., devices 315-1 and 315-2.

Figure 4B:
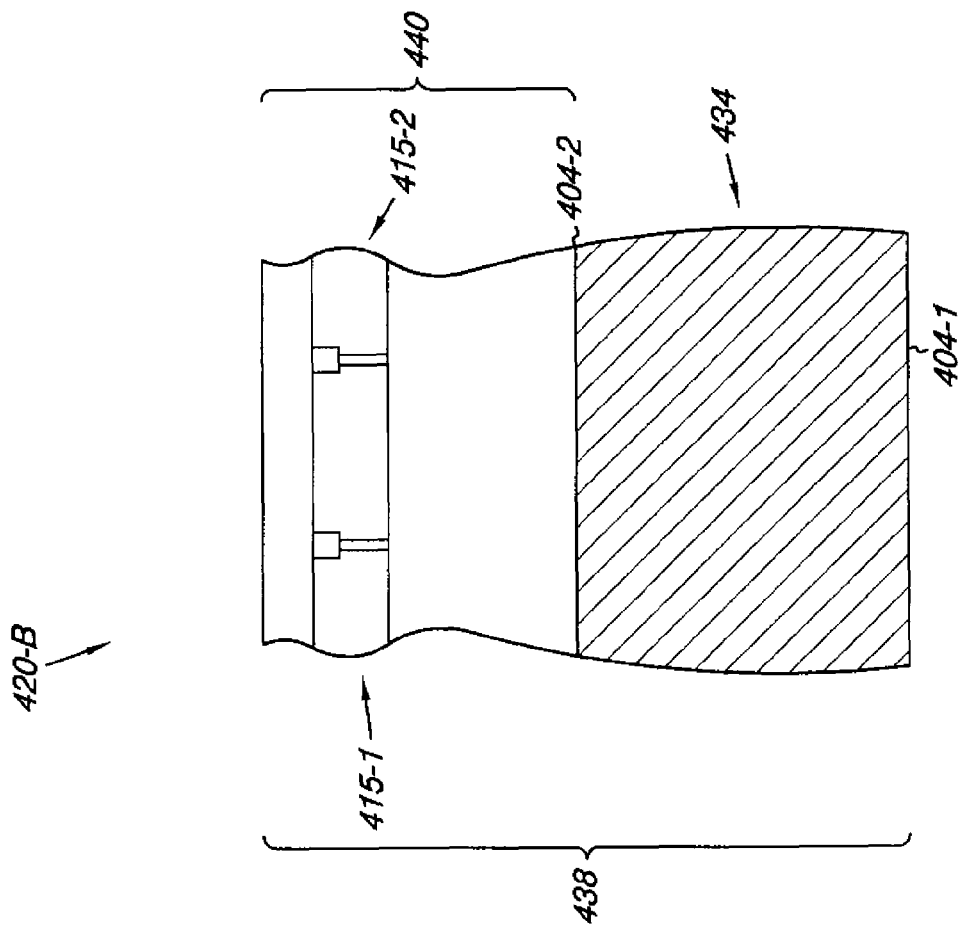
FIGS. 4A-4C illustrate cross-sectional side views of segments of a semiconductor wafer processed according to one or more embodiments of the present disclosure.
Figure 4A:
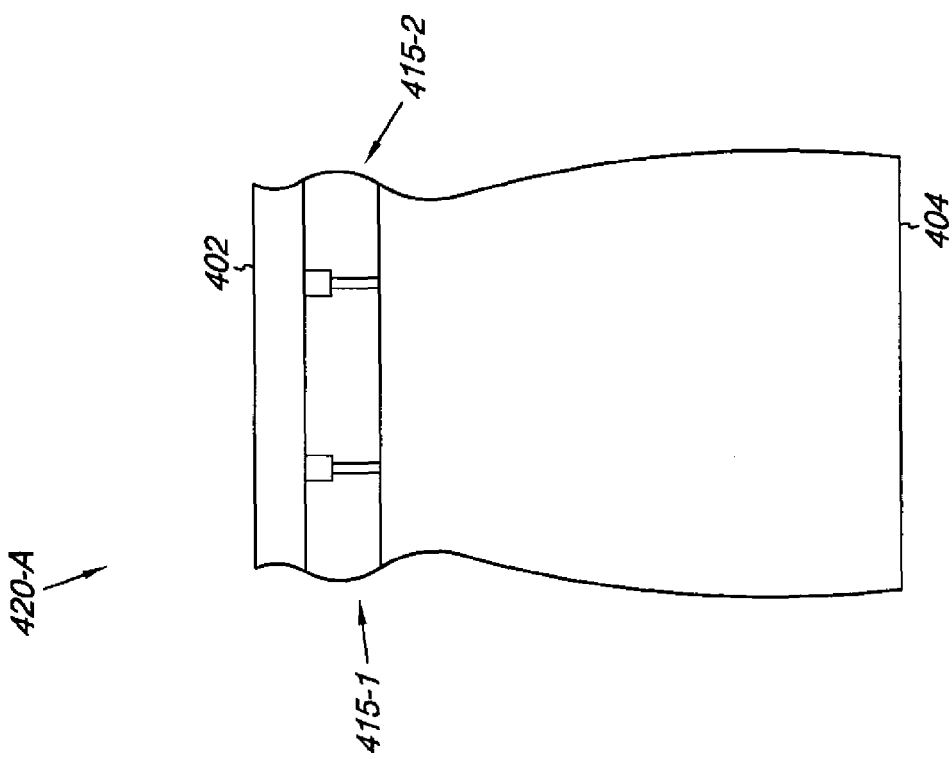
Figure 4C:
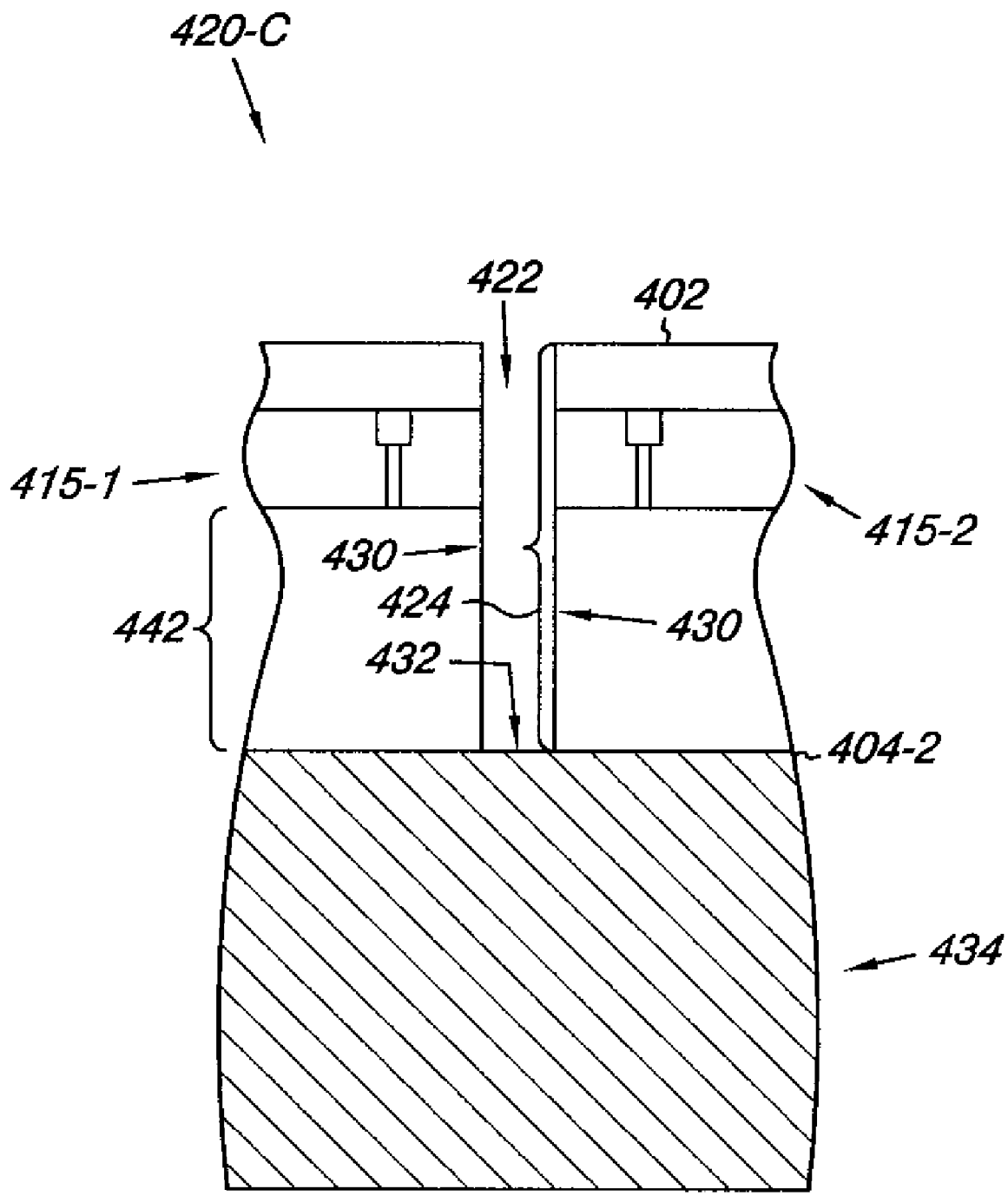

FIGS. 4A-4C illustrate cross-sectional side views of segments of a semiconductor wafer processed according to one or more embodiments of the present disclosure. The processes illustrated in FIGS. 4A-4C can function to singulate a semiconductor wafer into a number of dice without the use of a rotating saw blade, backgrinder, or polisher on a surface of the wafer opposed to an open trench. Such embodiments can be useful to reduce or eliminate the loss of device functionality due to microcrack propagation or other damage to electronic devices adjacent to one or more trenches.

FIG. 4A illustrates a cross-sectional view of a segment 420-A of a semiconductor substrate, e.g., bulk silicon, having a top surface 402, e.g., a front side of the wafer, and a bottom surface 404, e.g., a backside of the wafer. The segment 420-A of the semiconductor substrate is illustrated including a first device 415-1 and a second device 415-2 formed proximate to the top surface 402, e.g., front side of the wafer, according to a process that will be understood by one of ordinary skill in the art. In various embodiments, the devices 415-1 and 415-2 may comprise electronic devices or testing circuits.

FIG. 4B illustrates a cross-sectional view of a segment 420-B of the semiconductor substrate, e.g., segment 420-A illustrated in FIG. 4A, at a subsequent processing point. After the devices 415-1 and 415-2 have been formed, the backside 404-1 (before thinning), e.g., bottom, of the wafer can be thinned 434, e.g., through mechanical backgrinding, chemical etching, mechanical polishing, and/or chemical mechanical polishing, to a second backside 404-2 (after thinning). Prior to thinning, a protective layer may be applied to the wafer to protect the previously formed devices 415-1 and 415-2. Prior to device formation and thinning 434, the semiconductor wafer can have an initial thickness 438 between 500-750 micrometers. For example, the wafer may be thinned 434 to a final thickness 440 between 100-300 micrometers. Embodiments are not so limited.

FIG. 4C illustrates a cross-sectional view of a segment 420-C of the semiconductor substrate, e.g., segment 420-B illustrated in FIG. 4B, at a subsequent processing point. After the wafer has been thinned 434, a top surface 402, e.g., a front side of the wafer, can be etched between the electronic devices. From a top view perspective, the wafer can be etched in a number of rows and columns between the electronic devices. In one or more embodiments, this processing step can etch from a top surface 402, e.g., a front side of the wafer, through to a bottom surface 404-2, e.g., a backside of the wafer. When the etching process occurs after thinning 434, a trench 422 formed by etching can pass completely through the wafer so as to singulate the wafer into a number of dice corresponding to a number of devices 415-1 and 415-2.

According to such embodiments, mechanical damage free die singulation is possible. Such embodiments have an additional advantage over some previous approaches that etch trenches 422 before wafer thinning 434 because such embodiments backgrind to a thickness substantially equivalent to the depth 424 of the trenches 422. Such previous approaches can allow transfer of vibrations and physical stress along the trench side walls 430 to the edge of the devices 415-1 and 415-2 when the grinder is in close proximity to the bottom 432 of the trench 422, potentially affecting the functionality of the devices 415-1 and 415-2. In contrast, the above described embodiments of the present disclosure thin 434 the wafer before etching, which allows a backgrinder to stop a substantial distance, e.g., distance 442, e.g., more than 40 micrometers, from the devices 415-1 and 415-2 without transferring energy along a previously formed trench side walls 430. Additionally, one or more test circuits can be placed, prior to etching, proximate to the top surface 402, e.g., front side, of the semiconductor wafer thereby allowing testing of a number of electronic devices, e.g., devices 415-1 and 415-2, previously formed on the wafer.

FIGS. 5A-5F illustrate cross-sectional side views of segments of a semiconductor wafer processed according to one or more embodiments of the present disclosure. The processes illustrated in FIGS. 5A-5F can function to singulate a semiconductor wafer into a number of dice without the use of a rotating saw blade, while providing trenches filled with a material that can act as a stress buffer while the wafer is being thinned. Subsequently, the filler material can be removed to singulate the dice. Such embodiments can be useful to reduce or eliminate the loss of device functionality due to microcrack propagation or other damage to electronic devices adjacent to one or more trenches.

Figure 5A:
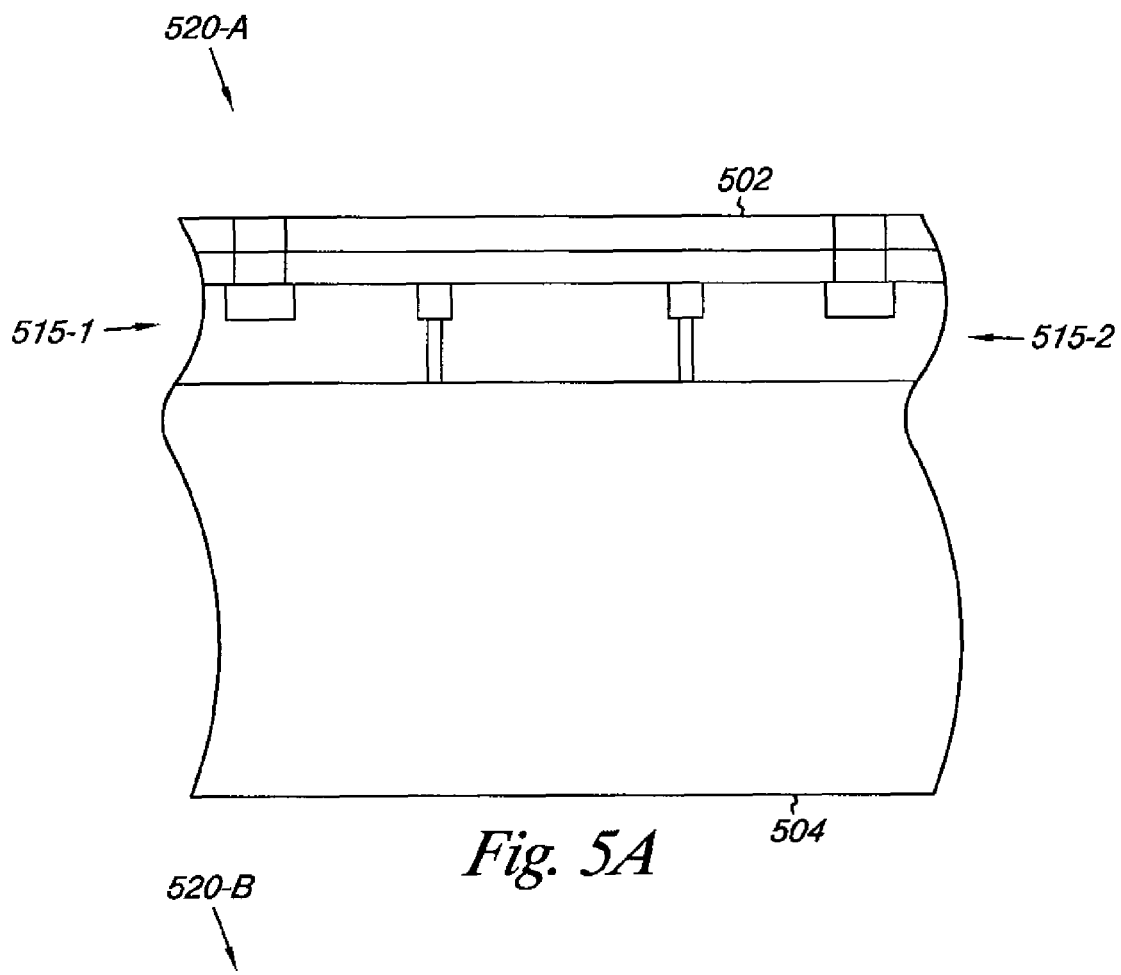
FIGS. 5A-5F illustrate cross-sectional side views of segments of a semiconductor wafer processed according to one or more embodiments of the present disclosure.

FIG. 5A illustrates a cross-sectional view of a segment 520-A of a semiconductor substrate, e.g., bulk silicon, having a top surface 502, e.g., a front side of the wafer, and a bottom surface 504, e.g., a backside of the wafer. The segment 520-A of the semiconductor substrate is illustrated including a first device 515-1 and a second device 515-2 formed proximate to the top surface 502, e.g., front side, of the wafer according to a process that will be understood by one of ordinary skill in the art. In various embodiments, the devices 515-1 and 515-2 may comprise electronic and/or testing circuits.

Figure 5B:
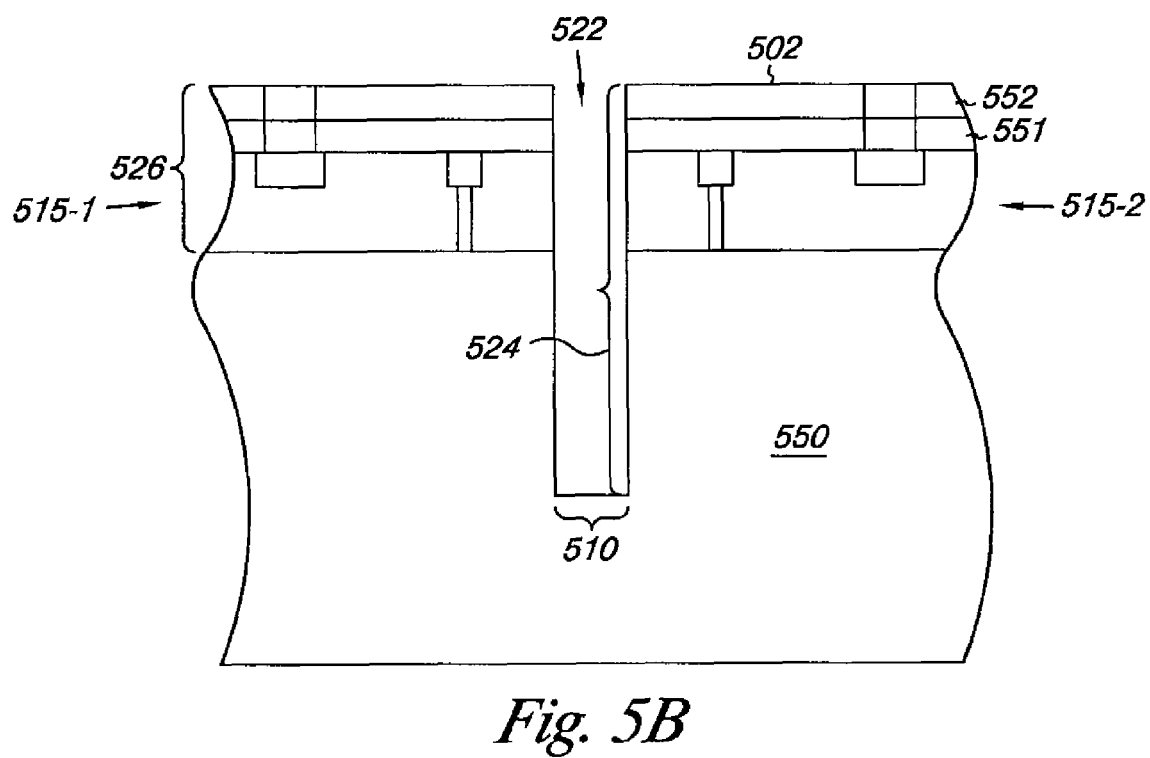

FIG. 5B illustrates a cross-sectional view of a segment 520-B of the semiconductor substrate, e.g., segment 520-A illustrated in FIG. 5A, at a subsequent processing point. After the devices 515-1 and 515-2 have been formed, a trench 522 can be etched into the top surface 502, e.g., front side, of the semiconductor wafer. As illustrated in FIG. 5B, the trench 522 can extend to a depth 524 greater than the depth 526 of the electronic and/or testing circuit. For example, the trench 522 can be etched to a depth 524 between approximately 30-60 micrometers from the top surface 502 of the wafer, e.g., where the top surface 502 can include the bulk wafer 550 and any additional layers, e.g., layers 551 and 552, added prior to etching. The trench 522 can be etched to a width 510 between approximately 5-10 micrometers. The devices 515-1 and 515-2 can have a depth 526 between approximately 3-5 micrometers from the top surface 502 of the wafer, where the depth 526 of the device can include any layers, e.g., layers 551 and 552, applied over the device, e.g., a passivation layer. The trench 522 can be etched according to processes described above with respect to FIG. 3A or with other etching methods known to one of ordinary skill in the art. When viewed from a top view, etches in the semiconductor wafer can extend along the length of each street, forming perpendicular rows and columns on the front side 502 of the wafer.

Figure 5C:
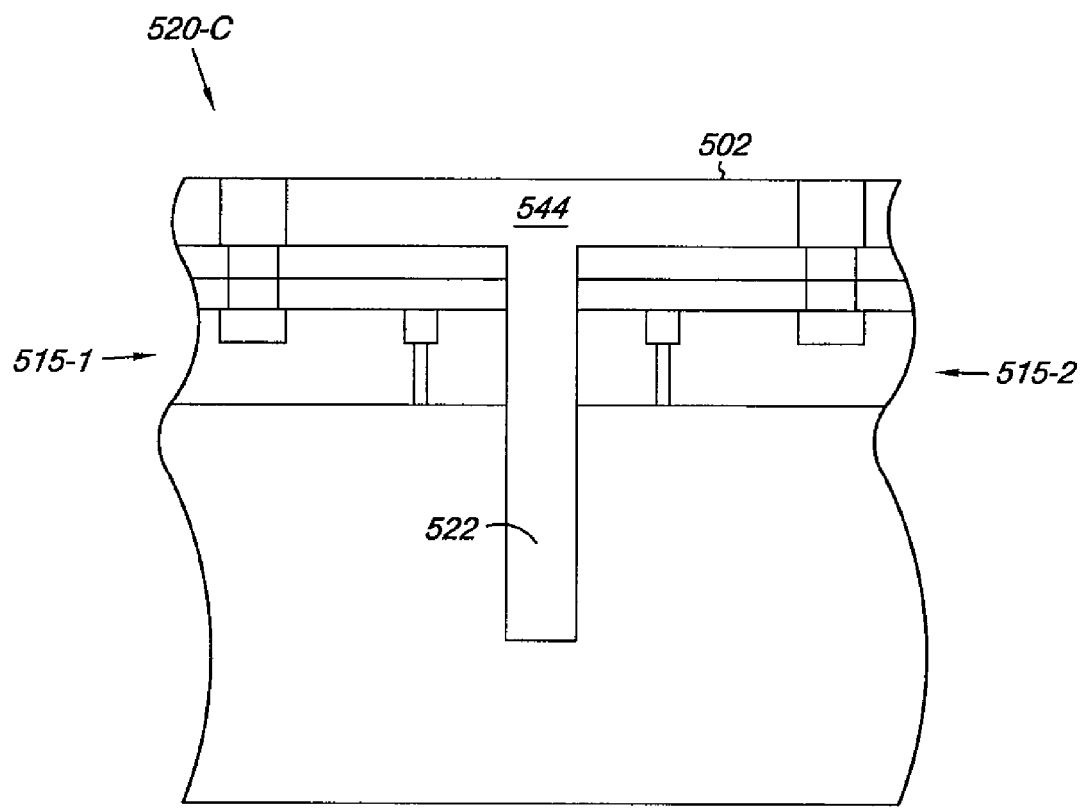

FIG. 5C illustrates a cross-sectional view of a segment 520-C of the semiconductor substrate, e.g., segment 520-B illustrated in FIG. 5B, at a subsequent processing point. After the trenches 522 have been formed, a polyimide layer 544 or resist layer can be deposited to fill the trenches 522 and cover the devices 515-1 and 515-2, e.g., forming a uniform top surface 502 on the semiconductor wafer. The polyimide layer 544 can serve as a stress buffer due to its shock resistant properties during later processing steps to help protect the devices 515-1 and 515-2 previously formed in the wafer.

Figure 5D:
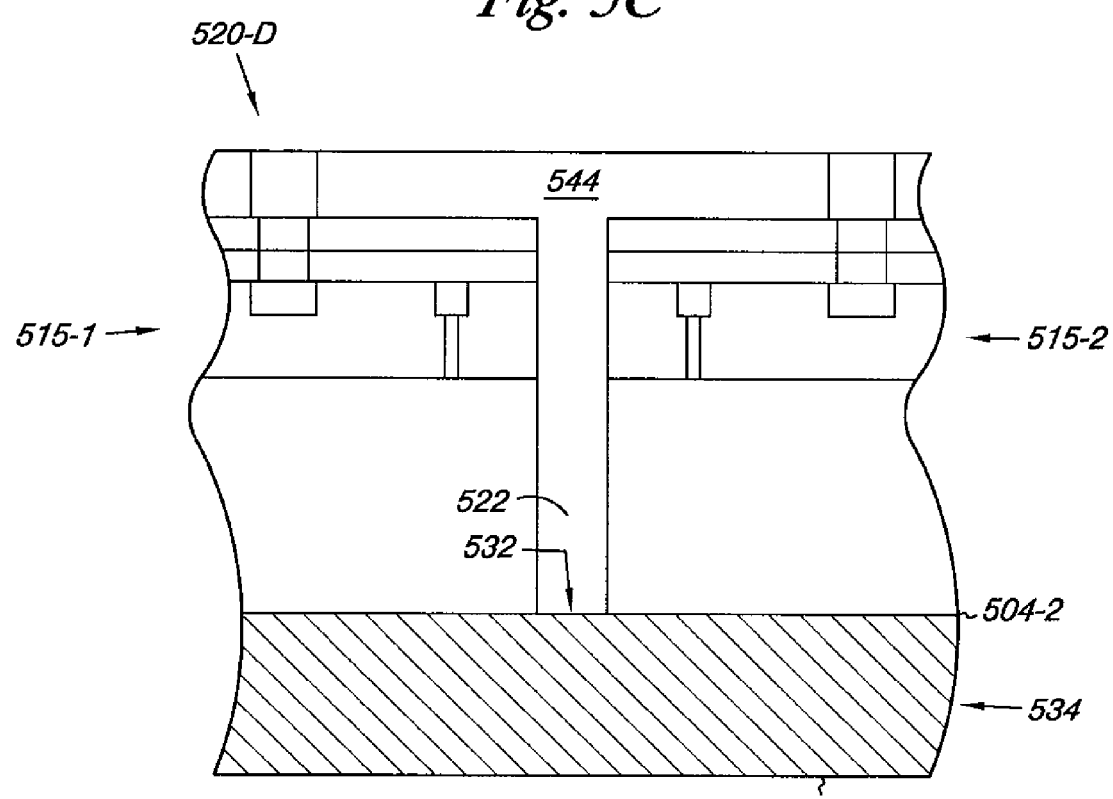

FIG. 5D illustrates a cross-sectional view of a segment 520-D of the semiconductor substrate, e.g., segment 520-C illustrated in FIG. 5C, at a subsequent processing point. After the polyimide layer 544 has been deposited, the backside 504-1 (before thinning), e.g., bottom, of the wafer can be thinned 534 to a second backside 504-2 (after thinning), e.g., through mechanical backgrinding, chemical etching, mechanical polishing, and/or chemical mechanical polishing. The backside 504-2 (after thinning), e.g., bottom of the wafer, can be thinned to a point substantially equal to the bottom 532 of the polyimide 544 filled trench 522. Prior to thinning 534, a protective layer may be applied to the wafer to protect the previously formed devices 515-1 and 515-2.

Figure 5E:
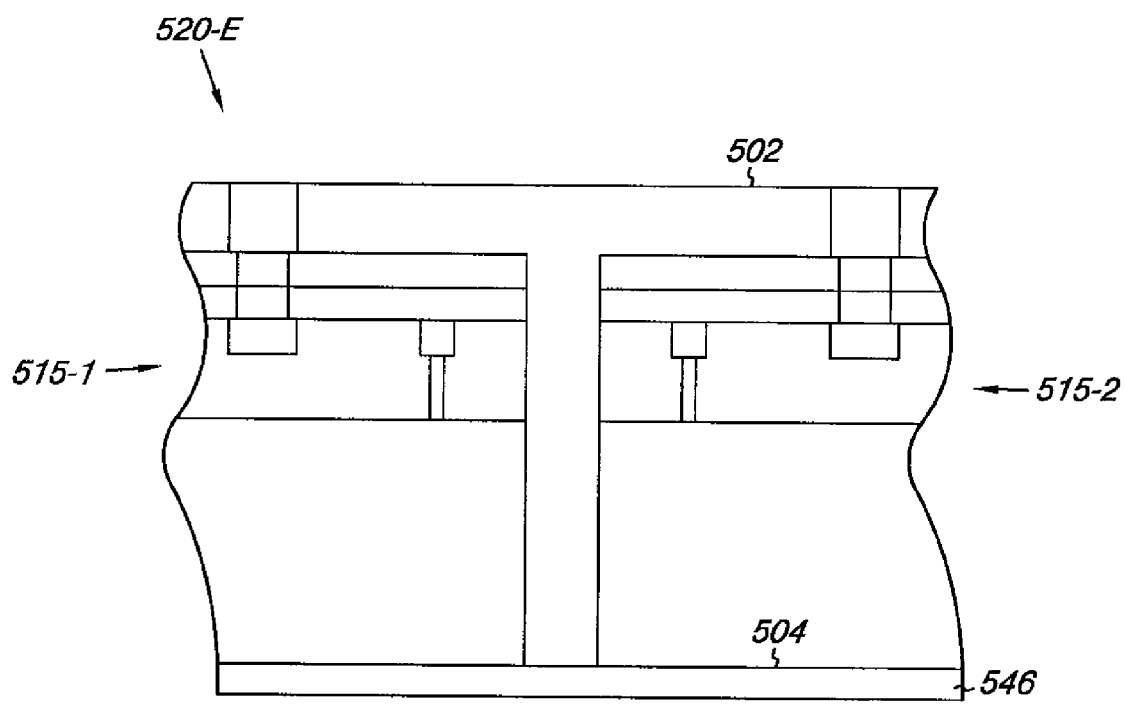

FIG. 5E illustrates a cross-sectional view of a segment 520-E of the semiconductor substrate, e.g., segment 520-D illustrated in FIG. 5D, at a subsequent processing point. After the wafer has been thinned, e.g., thinning 534 in FIG. 5D, a layer of adhesive material 546, e.g., dicing tape, may be applied to the backside 504, e.g., bottom, of the wafer. Subsequently the wafer can be released from the top 502, e.g., front side. The layer of adhesive material 526 can support the devices 515-1 and 515-2 during later processing points.

Figure 5F:
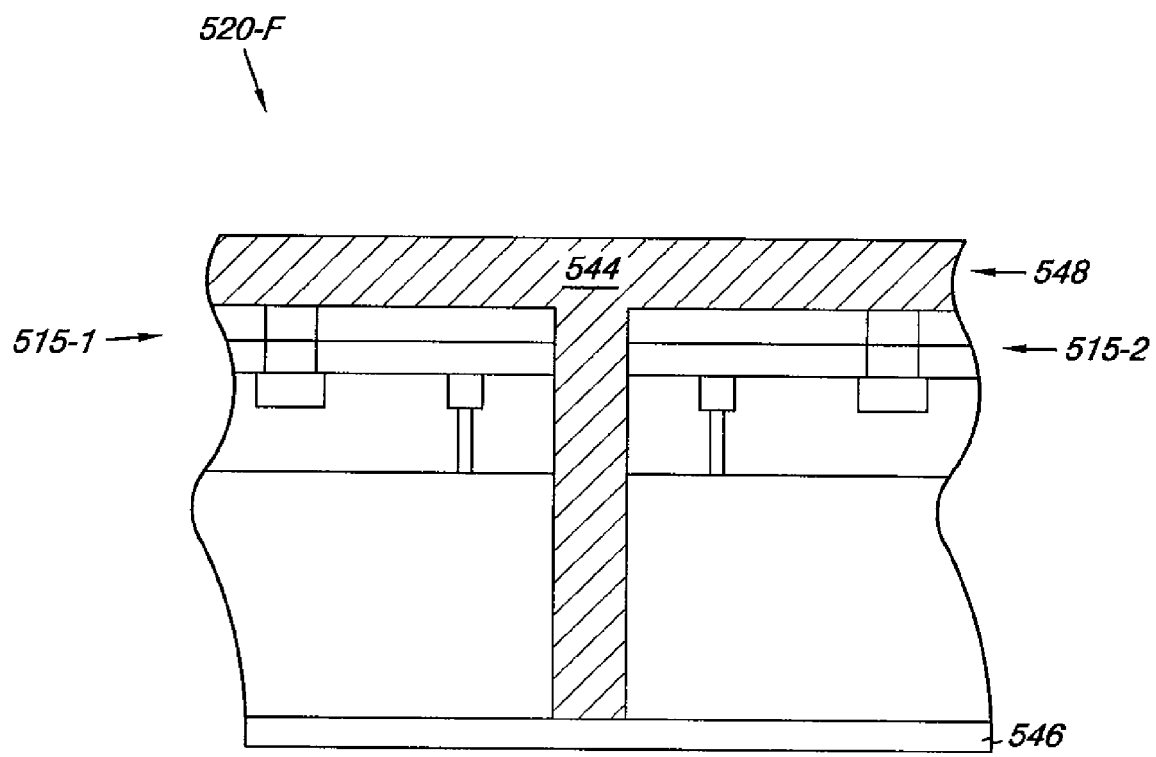

FIG. 5F illustrates a cross-sectional view of a segment 520-F of the semiconductor substrate, e.g., segment 520-E illustrated in FIG. 5E, at a subsequent processing point. After the layer of adhesive material 546 has been applied, the polyimide layer 544 can be removed 548, e.g., wet removal. For example, the polyimide layer 544 can be removed 548 through application of an acid such as sulfuric acid. Another example of a method to remove 548 the polyimide layer 544 is with a frequency-based energy source, e.g., ultrasonic energy, provided in U.S. Pat. No. 5,925,260 to Jiang. Following the removal of polyimide 544, a deionized water flush can be performed to rinse away material remaining after the wet removal. After the polyimide layer 544 has been removed, the wafer will have been singulated into dice, e.g., devices 515-1 and 515-2. Although the dice may still be attached to the layer of adhesive material 546, e.g., dicing tape, the dice can be picked for packaging.

Methods for processing semiconductor wafers are described herein. One embodiment includes removing portions of a first side of the semiconductor wafer to form a number of trenches of a particular depth in rows and columns. The method further includes forming a passivation layer on side walls of the number of trenches. The method also includes cutting a second side of the semiconductor wafer in rows and columns aligned with the number of trenches such that the semiconductor wafer singulates into a number of dice.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for processing a semiconductor wafer, comprising:
    forming a number of electronic devices on a first side of the semiconductor wafer;
    removing portions of the first side of the semiconductor wafer to form a first number of trench rows to a first width wherein each of the first number of trench rows includes a continuous bottom surface and a second number of trench rows to a second width wherein each of the second number of trench rows includes a continuous bottom surface;
    removing portions of the first side of the semiconductor wafer to form a first number of trench columns to a third width wherein each of the first number of trench columns includes a continuous bottom surface and a second number of trench columns to a fourth width wherein each of the second number of trench columns includes a continuous bottom surface;
    forming a number of test circuits on the semiconductor wafer; and
    cutting a second side of the semiconductor wafer in rows and columns aligned with the number of trenches such that the semiconductor wafer singulates into a number of dice corresponding to the number of electronic devices wherein at least one of the first, second, third, and fourth widths is a different width than at least one of the other widths.

2. The method of claim 1, wherein the method includes thinning the second side of the semiconductor wafer prior to cutting the second side.

3. The method of claim 1, wherein:
    the first width is equal to the second width; and
    the third width is equal to the fourth width.

4. The method of claim 3, wherein:
    forming the first number of trench rows includes etching to a width less than 10 micrometers;
    forming the first number of trench columns includes etching to a width greater than 25 micrometers.

5. The method of claim 4, wherein forming the number of test circuits includes forming the number of test circuits on the semiconductor wafer in one or more streets corresponding to the first and second numbers of trench columns.

6. The method of claim 1, wherein:
    forming the first number of trench rows includes etching every other trench row on the first side of the semiconductor wafer to the first width, which is greater than the second width; and
    forming the first number of trench columns includes etching every other trench column on the first side of the semiconductor wafer to the third width, which is greater than the fourth width.

7. The method of claim 6, wherein forming the number of test circuits includes forming the number of test circuits on the semiconductor wafer in one or more streets corresponding to the first number of trench rows and the first number of trench columns.

8. The method of claim 1, wherein forming the first number of trench rows includes etching trench rows proximate to a center of the semiconductor wafer to the first width, which is less than the second width; and
    forming the first number of trench columns includes etching trench columns proximate to the center of the semiconductor wafer to the third width, which is less than the fourth width.

9. The method of claim 8, wherein forming the number of test circuits includes forming a first number of test circuits on dice proximate to the center of the semiconductor wafer; and
    forming a second number of test circuits in streets corresponding to the second number of trench rows or the second number of trench columns.

10. The method of claim 1, wherein the first width, the second width, and the third width are equal to the fourth width.

11. The method of claim 10, wherein forming the number of test circuits includes forming the number of test circuits on dice of the semiconductor wafer.

12. A method for processing a semiconductor wafer, comprising:
forming a number of electronic devices on dice on the semiconductor wafer;
removing portions of the semiconductor wafer to form trench rows and trench columns to a first width proximate to a center of the semiconductor wafer;
removing portions of the semiconductor wafer to form trench rows and trench columns to a second width greater than the first width distal to the center of the semiconductor wafer;
forming a number of test circuits on dice proximate to the center of the semiconductor wafer; and
forming a number of test circuits in streets distal to the center of the semiconductor wafer wherein each of the trench rows of both the first width and the second width includes continuous bottom surfaces.

13. The method of claim 12, wherein the method includes:
testing one or more of the number of electronic devices proximate to the center of the semiconductor wafer with one or more of the number of test circuits on dice proximate to the center of the semiconductor wafer; and
testing one or more of the number of electronic devices distal to the center of the semiconductor wafer with one or more of the number of test circuits in streets distal to the center of the semiconductor wafer.

14. The method of claim 12, wherein the method includes:
forming the number of electronic devices and the number of test circuits on a first side of the semiconductor wafer;
forming the trench rows and the trench columns on the first side of the semiconductor wafer; and
singulating the dice by removing portions of a second side of the semiconductor wafer to contact the number of trench rows and trench columns.

15. The method of claim 14, wherein the method includes forming a passivation layer in the trench rows and trench columns prior to singulating the dice.

16. The method of claim 14, wherein removing portions of the second side of the semiconductor wafer includes cutting the second side of the semiconductor wafer.

17. The method of claim 14, wherein removing portions of the second side of the semiconductor wafer includes thinning the second side of the semiconductor wafer.

18. A method for processing a semiconductor wafer, comprising:
forming a number of electronic devices on dice on the semiconductor wafer;
removing portions of the semiconductor wafer to form trench rows in alternating first and second widths, wherein the second width is greater than the first width and wherein each of the trench rows includes a continuous bottom surface;
removing portions of the semiconductor wafer to form trench columns in alternating first and second widths wherein each of the trench columns includes a continuous bottom surface; and
forming a number of test circuits in streets of the second width.

19. The method of claim 18, wherein removing portions of the semiconductor wafer includes etching to a depth greater than a depth of the number of electronic devices.

20. The method of claim 19, wherein forming the number of electronic devices includes forming the number of electronic devices on a first side of the semiconductor wafer; and
the method includes singulating the dice by removing portions of a second side of the semiconductor wafer to contact the trench rows and the trench columns.

* * * * *

UNITED STATES PATENT AND TRADEMARK OFFICE
CERTIFICATE OF CORRECTION

| | | |
|---|---|---|
| PATENT NO. | : 7,897,485 B2 | Page 1 of 1 |
| APPLICATION NO. | : 12/504385 | |
| DATED | : March 1, 2011 | |
| INVENTOR(S) | : Kunal R. Parekh | |

It is certified that error appears in the above-identified patent and that said Letters Patent is hereby corrected as shown below:

On the title page, in item (74), in "Attorney, Agent, or Firm", in column 2, line 2, delete "Huesbch," and insert -- Huebsch, --, therefor.

Signed and Sealed this
Nineteenth Day of April, 2011

David J. Kappos
*Director of the United States Patent and Trademark Office*